United States Patent [19]
Wehrmacher

[11] Patent Number: 5,134,314
[45] Date of Patent: Jul. 28, 1992

[54] AUTOMATIC PIN CIRCUITRY SHUTOFF FOR AN INTEGRATED CIRCUIT

[75] Inventor: John R. Wehrmacher, Dallas, Tex.

[73] Assignee: VLSI Technology, Inc., San Jose, Calif.

[21] Appl. No.: 629,529

[22] Filed: Dec. 18, 1990

[51] Int. Cl.$^5$ .................... H03K 17/16; G01R 31/28
[52] U.S. Cl. .................................. 307/443; 307/473; 307/475; 307/540; 324/73.1; 324/158 R
[58] Field of Search ............ 307/443, 473, 475, 480, 307/303, 540; 324/73.1, 158 R

[56] References Cited

U.S. PATENT DOCUMENTS

| | | | |
|---|---|---|---|
| 3,466,544 | 9/1969 | Balderston | 324/158 R |
| 4,704,551 | 11/1987 | Berger | 307/473 X |
| 4,707,654 | 11/1987 | Suzuki et al. | 324/158 R |
| 4,714,876 | 12/1987 | Gay et al. | 324/73 R |
| 4,894,605 | 1/1990 | Ringleb et al. | 324/158 R |
| 4,970,454 | 11/1990 | Stambaugh et al. | 324/73.1 |
| 4,998,026 | 3/1991 | King | 307/270 |
| 5,025,344 | 6/1991 | Maly et al. | 324/73.1 |
| 5,032,783 | 7/1991 | Hwang et al. | 324/158 R |
| 5,034,687 | 7/1991 | Huang et al. | 324/158 R |

Primary Examiner—Eugene R. LaRoche
Assistant Examiner—Son Dinh
Attorney, Agent, or Firm—Douglas L. Weller

[57] ABSTRACT

A method and circuitry allows for the prevention of tester induced failures and reliability problems which occur when a tester creates bus contention by overdriving output pins of an integrated circuit. For each input/output (I/O) pad which is used for the output of data, a first signal on an output data line is compared with a second signal which is currently on the I/O pad. When the output is enabled and the comparison indicates the first signal is not equal to the second signal, the I/O pad is isolated from the output data line. The I/O pad is isolated, and thus in shutdown mode, until the I/O pad is no longer being driven to a signal value which is different than the signal value of the first signal on the output data line. Further, each I/O pad may be electrically isolated from its output data line whenever a comparison for any I/O pad indicates that the signal for the I/O pad is not equal to the signal on its output data line. In one embodiment, once all of the I/O pads is in shutdown mode, they are held in shutdown mode until a reset signal is received.

22 Claims, 4 Drawing Sheets

AUTOMATIC PIN CIRCUITRY SHUTOFF FOR AN INTEGRATED CIRCUIT

BACKGROUND

The present invention concerns a method to protect integrated circuits by providing circuitry which isolates a pin when bus contention is detected.

Circuit boards often contain a number of integrated circuits. During testing of a circuit board, typically the circuit board is powered up and a tester places test vectors on the inputs of one or more integrated circuits. However the placement of test vectors on some integrated circuits can result in the tester overdriving the outputs of other integrated circuits which are on the board and which are not being tested. When the output of an integrated circuit is overdriven for an extended period of time, the current generated can cause metal migration and other destructive defects within the integrated circuit.

It is desirable, therefore, to stop the tester induced failures and long term reliability problems which can occur when a tester overdrives output pins of integrated circuits.

SUMMARY OF THE INVENTION

In accordance with the preferred embodiment of the present invention, a method and circuitry is provided which allow for the prevention of tester induced failures and reliability problems which occur when a tester creates bus contention by overdriving output pins of an integrated circuit. For each input/output (I/O) pad which is used for the output of data, a first signal on an output data line is compared with a second signal currently on the I/O pad. When the comparison indicates the first signal is not equal to the second signal and output is enabled, the I/O pad is isolated from the output data line. The I/O pad is isolated, and thus in shutdown mode, until the I/O pad is no longer being driven to a signal value which is different than the value of the first signal on the output data line.

In order to provide for earlier detection of a tester causing bus contention and to provide for less toggling of individual I/O pads from shutdown to operation modes, each I/O pad may be electrically isolated from its output data line whenever a comparison for any I/O pad indicates output is enabled and the signal for the I/O pad is not equal to the signal on its output data line. Also, in one embodiment, once any or all of the I/O pads is in shutdown mode, the I/O pads are held in shutdown mode until a reset signal is received.

The circuitry that implements the present invention may supplement the circuitry typically used with an I/O pad. For example, typically an output data line is coupled to an I/O pad through a tri-state output buffer/amplifier. The gate of the tri-state amplifier is typically controlled by an enable signal on an output enable line. In the preferred embodiment of the present invention this signal on the gate of the tri-state amplifier is produced by a logical gate which performs a logical OR on the enable signal and a shutdown signal.

The shutdown signal is produced as follows. For each I/O pad a logical Exclusive OR (XOR) is performed comparing the signal on the I/O pad with the signal on the output data line. The output of the logical XOR is gated with the output enable line. The resulting signal is placed through a positive glitch suppression (PGS) circuit which contains a delay with a delay time sufficient so that a shutdown is not produced prematurely by transition delay between the signal on the output data line and the signal on the I/O pad.

The individual signal output from the PGS circuit for each I/O pad may be directly connected as a shutdown signal to the logical OR gate which controls the tri-state amplifier for the I/O pad. Alternately, a logical OR function may be performed on all the signals produced by the PGS circuits to produce a single global shutdown signal to be forwarded to each logical OR gate which controls the tristate amplifier for an I/O pad. This global shutdown signal may also be placed through a flip-flop in order to maintain all the I/O pads in shutdown mode until a reset is received. The circuit may be simplified with the I/O pad is used only to output data.

DESCRIPTION OF THE PREFERRED EMBODIMENT

Figure 1:
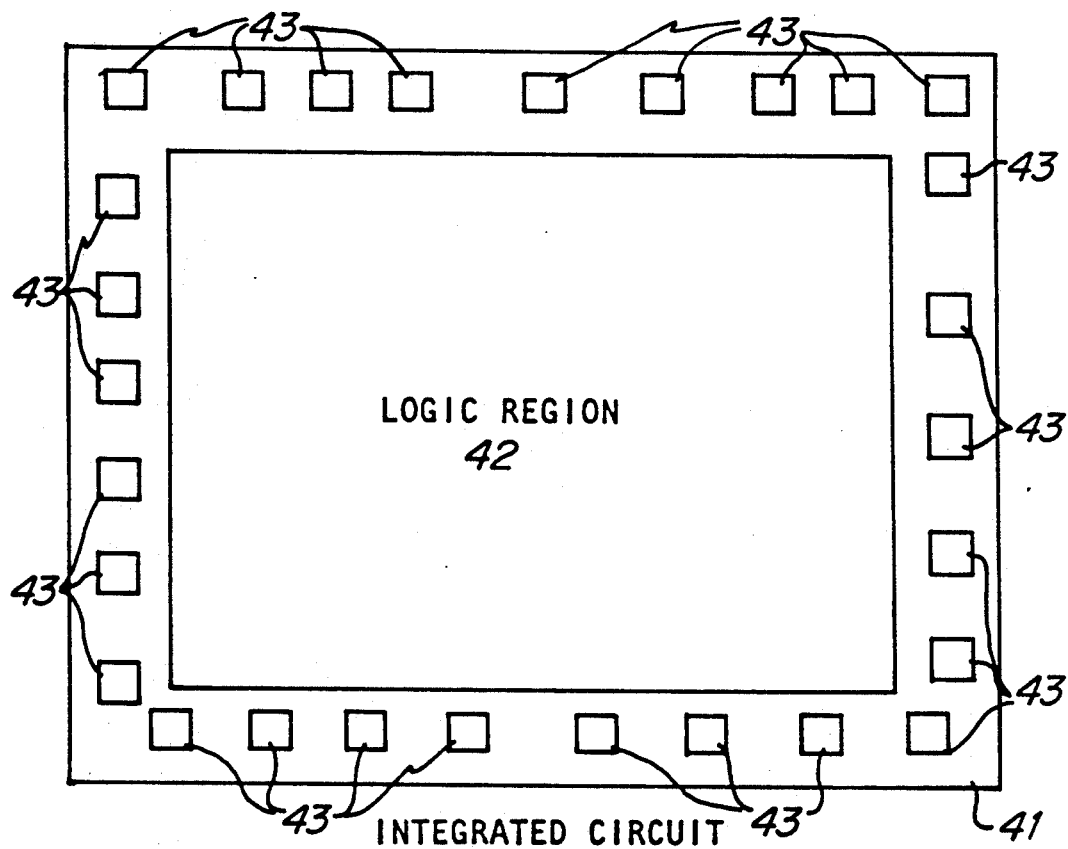
FIG. 1 shows a block diagram of the surface of an integrated circuit.

FIG. 1 shows a block diagram of the surface of an integrated circuit 41. A logic region 42 within integrated circuit 41 contains the logic circuitry which performs the logical operations of integrated circuit 41. Logical circuitry within logic region 42 is connected to entities outside of integrated circuit 41 through connections made through pads 43. For example, electrical connection may be established through wires soldered to pads 43 or through probes placed upon pads 43.

Certain of pads 43 may be dedicated to supply a power signal or clock signal, etc. to integrated circuit 41. Other of pads 43 are used for input/output (I/O) of data. I/O pads used for data transfer are typically bi-directional. That is each I/O pad is used both to transmit data and to receive data.

Figure 2:
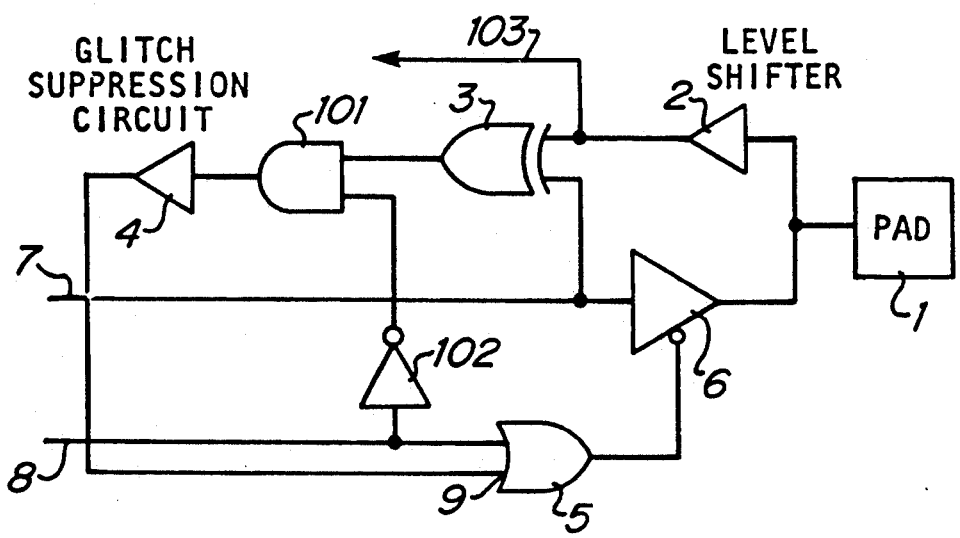
FIG. 2 shows a schematic of shutoff circuitry for an I/O pad of an integrated circuit in accordance with a preferred embodiment of the present invention.

FIG. 2 shows a schematic of circuitry which allows the isolation of an I/O pad 1 when bus contention is detected. I/O pad l is used for data transfer. When I/O pad 1 is used to transfer data from an integrated circuit, the integrated circuit places the output data on an output data line 7. An output enable 8 is asserted low in order to direct a tri-state output driver 6 to drive the appropriate output voltage onto I/O pad 1. Input data is placed on input data line 103.

As may be seen, shutoff circuitry has been added to assure that I/O pad 1 is not overdriven during the time I/O pad 1 is being used to transfer data. A logical OR gate 5 allows tri-state output driver 6 to be enabled only when I/O pad 1 is not being overdriven. This is done as follows. A level shifter 2 is used to translate the signals placed on I/O pad 1 to the internal voltages used by the integrated circuit. A logical EXCLUSIVE OR ("XOR") gate 3 compares the voltage on output data line 7 to the output of level shifter 2. When the output driver is enabled, these voltages should be the same. If they are the same, the output placed on I/O pad 1 is not being overdriven. In this case, output enable is asserted low, therefore, a logical NOT gate 102 places a logical 1 on an input of a logical AND gate 101. Logical XOR gate 3, however, places a logic 0 on the other input of logical AND gate 101 resulting in a logic 0 being placed on an input of a positive glitch suppression (PGS) circuit 4. The logic 0 will be forwarded to an input 9 of logical OR gate 5. An example of an implementation for PGS circuit 4 is given in FIG. 6. As long as input 9 of logical OR gate is at logic 0, the value on output enable 8 is logically connected through to tri-state output driver 6.

When XOR gate 3 detects the voltage on output data line 7 is at a different level than the output of level shifter 2 and output enable 8 is asserted low, a logic 1 is placed on the input of PGS circuit 4. The different levels on the input XOR gate 3 could be caused by the capacitance inherent in I/O pad 1 slowing a transition to a voltage being applied to I/O pad 1. However, if the output of logical AND gate 101 remains a logic 1 for some predetermined delay length, this indicates the output placed on I/O pad 1 is being 20 overdriven. Then, PGS circuit 4 forwards the logic 1 through to input 9 of logical OR gate 5. As long as input 9 of logical OR gate 5 is at logic 1, the value on output enable 8 is logically disconnected from tri-state output driver 6. Thus tri-state output driver 6 remains in a high impedance state, effectively isolating I/O pad 1 from circuitry within the integrated circuit.

The predetermined delay length within PGS circuit 4 is generally selected based on the size of I/O pad 1 and the resultant inherent capacitance. This could possibly be obtained by selecting the maximum delay for a specified capacitance as provided by reference to a data book or could be obtained using a circuit simulation program such as SPICE.

Figure 3:
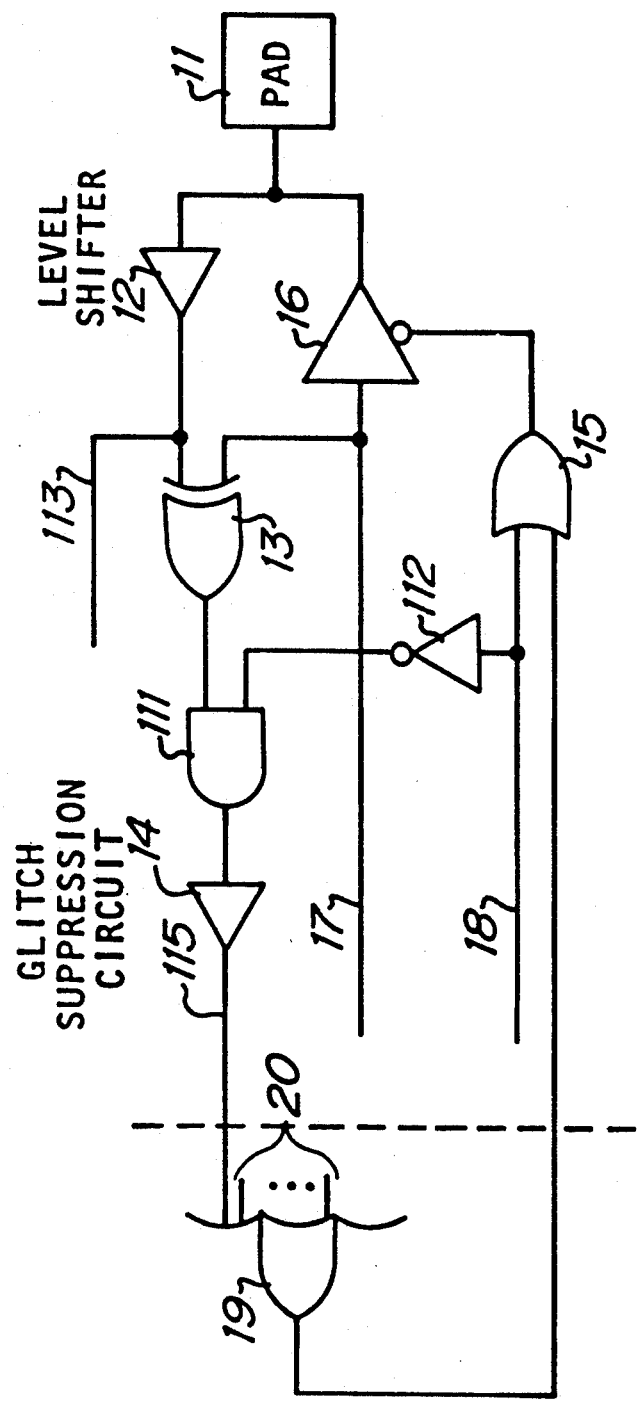
FIG. 3 shows a schematic of shutoff circuitry for an I/O pad of an integrated circuit in accordance with an alternate preferred embodiment of the present invention

Shutoff circuitry similar to that shown in FIG. 2 is provided for every I/O pad on the integrated circuit for which overdrive protection is desired FIG. 3 shows a schematic of an alternate embodiment of the present invention. When an I/O pad 11 is used to transfer data from an integrated circuit, the integrated circuit places the output data on an output data line 17. An output enable 18 is asserted in order to direct a tri-state output driver 16 to drive the appropriate output voltage onto I/O pad I1. Input data is placed on input data line 113.

A logical OR gate 15 allows tri-state output driver 16 to be enabled only when I/O pads from the integrated circuit are not being overdriven. A level shifter 12 is used to translate the signals placed o I/O pad 11 to the internal voltages used by the integrated circuit. A logical XOR gate 13 compares the voltage on output data line 17 to the output of level shifter 12. When these voltages are the same indicating output placed on I/O pad 11 is not being overdriven or when a logical AND gate 111 detects through a logical NOT gate 112 that output enable 18 is at logic 1 indicating no output is being placed on I/O pad 11, logical AND gate III places a logic 0 through a PGS circuit 14 to one of inputs 20 of a logical OR gate 19.

Similarly, when XOR gate 13 detects the voltage on output data line 17 is at a different level than the output of level shifter 12 and output enable 18 is at logic 0, logical AND gate 111 places a logic 1 on the input of PGS circuit 14. If the output of AND gate 111 remains a logic 1 for some predetermined delay length, this indicates the signal placed on I/O pad 11 is being overdriven. In this case, PGS circuit 14 forwards the logic 1 through to one of inputs 20 of a logical OR gate 19.

Each of inputs 20 of logical OR gate 19 receives an input from a different I/O pad on the integrated circuit. As long as the input from each I/O pad is at logic 0, indicating that no I/O pad is overdriven, a logic 0 is forwarded to logical OR gates which control tri-state output drivers for each I/O pad. Similarly, when one or more of 120 inputs 20 of logical OR gate 19 is at logic 1, indicating the input of one or more of the I/O pads of the integrated circuit is being overdriven, logical OR gate 19 forwards a logic I to logical OR gates which control tri-state output drivers for each I/O pad.

For the circuitry shown in FIG. 3, the output of logical OR gate 19 is shown coupled to a logical OR gate 15. When the output from logical OR gate 19 is at logic 0, logical OR gate 15 logically connects the signal on output enable 18 to tri-state output driver 16. When the output from logical OR gate 19 is at logic 1, logical OR gate 15 logically disconnects the signal on output enable 18 from tri-state output driver 16. Thus tri-state output driver 16 remains in a high impedance state, effectively isolating I/O pad 11 from circuitry within the integrated circuit.

Shutoff circuitry similar to that shown in FIG. 3 is provided for every I/O pad on the integrated circuit for which overdrive protection is desired, except however that a single logical OR gate 19 may be used to produce a single global signal for all the I/O pads. This design has the advantage over the embodiment shown in FIG. 2 in that it allows the integrated circuit to isolate its I/O pads earlier and provides for less toggling of individual I/O pads from shutdown to operation modes.

Figure 4:
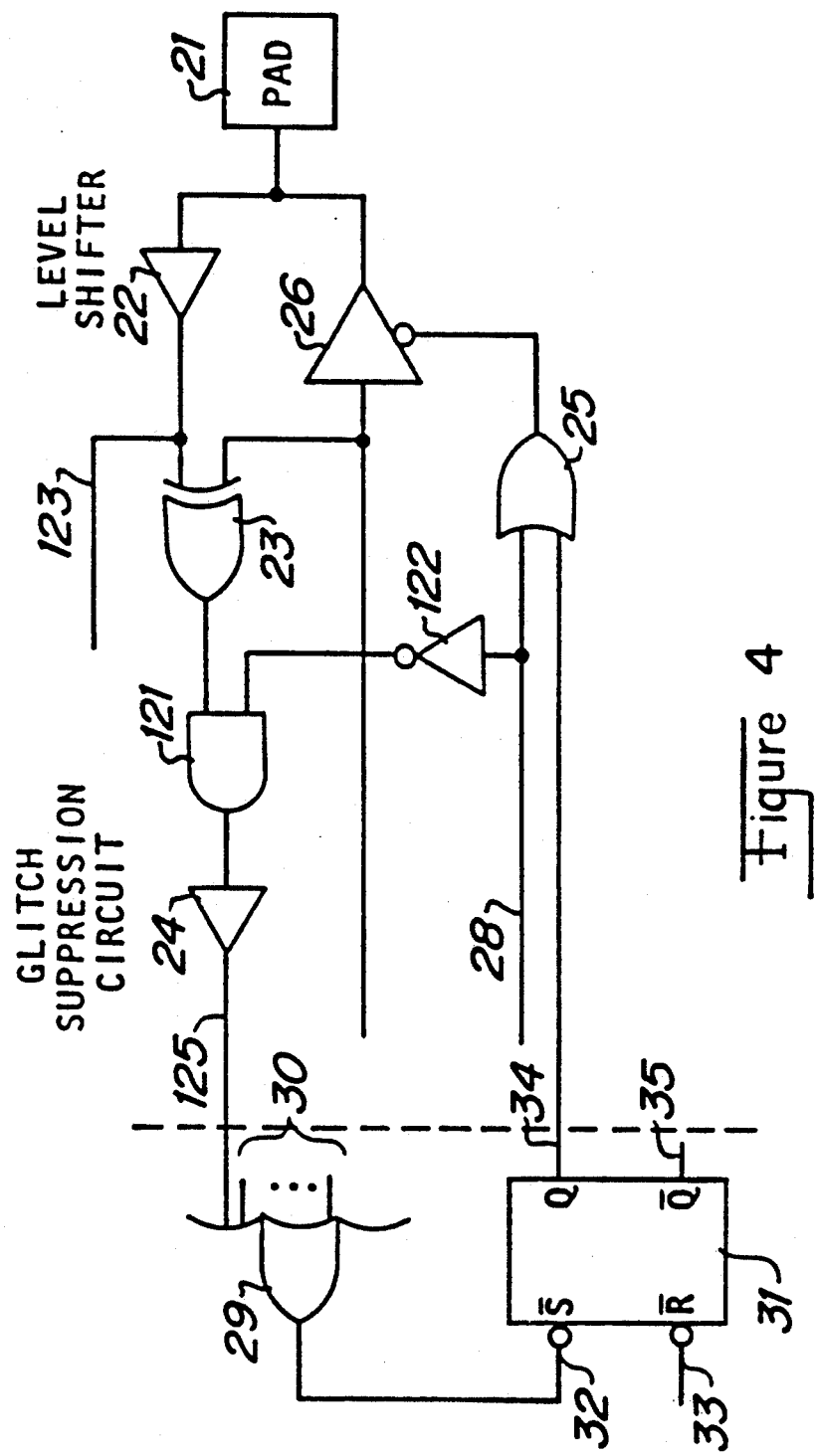
FIG. 4 shows a schematic of shutoff circuitry for an I/O pad of an integrated circuit in accordance with another alternate preferred embodiment of the present invention.

FIG. 4 shows a schematic of another alternate embodiment of the present invention. When an I/O pad 21 is used to transfer data from an integrated circuit, the integrated circuit places the output data on an output data line 27. An output enable 28 is asserted in order to direct a tri-state output driver 26 to drive the appropriate output voltage onto I/O pad 21. Input data is placed on input data line 123.

A logical OR gate 25 allows tri-state output driver 26 to be enabled only when I/O pads from the integrated circuit have not been overdriven. A level shifter 22 is used to translate the signals placed on I/O pad 21 to the internal voltages used by the integrated circuit. A logical XOR gate compares the voltage on output data line 27 to the output of level shifter 22. When these voltages are the same indicating output placed on I/O pad 21 is not being overdriven or when a logical AND gate 121 detects through a logical NOT gate 122 that output enable 28 is at logic 1 indicating no output is being placed on I/O pad 21, logical AND gate 121 places a logic 0 through a PGS circuit 24 to one of inputs 30 of a logical NOR gate 29.

Similarly, when XOR gate 23 detects the voltage on output data line 27 is at a different level than the output of level shifter 22 and output enable 28 is at logic 0, logical AND gate 121 places a logic 1 on the input of PGS circuit 24. If the output of logical AND gate 121 remains a logic 1 for some predetermined delay length, this indicates the signal placed on I/O pad 21 is being overdriven. In this case, PGS circuit 24 forwards the logic 1 through to one of inputs 30 of a logical NOR gate 29.

Each of inputs 30 of logical NOR gate 29 receives an input from a different I/O pad on the integrated circuit. As long as the input from each I/O pad is at logic 0, indicating that no I/O pad is overdriven, a logic 1 is placed upon a "NOT S" input 32 of a Set/Reset (SR) Flip-flop (FF) 31. As long as the signal placed on input 32 of SR FF 31 remains at logic 1, SR FF 31 remains not set and a Q output 34 of SR FF 31 remains at logic 0. The logic 0 on output 34 of SR FF 31 is forwarded to logical OR gates which control tri-state output drivers for each I/O pad.

When one or more of inputs 30 of logical NOR gate 29 is at logic 1, indicating the input of one or more of the I/O pads of the integrated circuit is being overdriven, logical NOR gate 29 forwards a logic 0 to SR FF 31. SR FF 31 is then set and remains set until a logic 0 is placed upon a "NOT R" input 33 of SR FF 31. When SR FF 31 is set, Q output 34 of SR FF 31 remains at logic 1. The logic 1 on output 34 of SR FF 31 is forwarded to the logical OR gates which control tri-state output drivers for each I/O pad. A not Q output 35 of SR FF 31 is not used.

For the circuitry shown in FIG. 4, Q output 34 of SR FF 31 is shown coupled to a logical OR gate 25. When output 34 is at logic 0, logical OR gate 25 logically connects the signal on output enable 28 to tri-state output driver 26. When output 34 is at logic 1, logical OR gate 25 logically disconnects the signal on output enable 28 from tri-state output driver 26. Thus tri-state output driver 26 remains in a high impedance state, effectively isolating I/O pad 21 from circuitry within the integrated circuit.

Shutoff circuitry similar to that shown in FIG. 4 is provided for every I/O pad on the integrated circuit for which overdrive protection is desired, except however that a single logical NOR gate 29 and single SR FF 31 may be used to produce a single global signal for all the I/O pads. This design is advantageous over the embodiment shown in FIG. 4 in that once any of the I/O pads are overdriven, all the I/O pads remain in a shutdown state until a reset is issued to return the circuitry to a normal operating mode.

Figure 5:
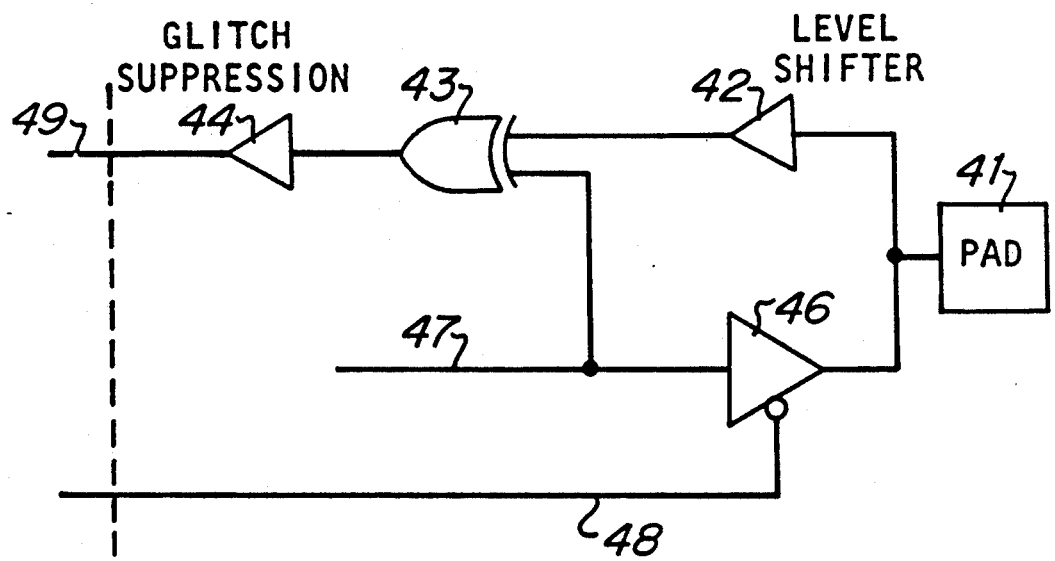
FIG. 5 shows a schematic of shutdown circuitry used for an output only I/O pad of an integrated circuit in accordance with a preferred embodiment of the present invention.

FIG. 5 shows how shutoff circuitry may be simplified when an I/O pad 41 is used for output only. When I/O pad 41 is used to transfer data from an integrated circuit, the integrated circuit places the output data on an output data line 47. A tri-state output driver 46 allows output data through to I/O pad 41 only when shutdown line 48 is at logic 0.

Tri-state output driver 46 is enabled only when I/O pad 41 is not being overdriven. This is done as follows. A level shifter 42 is used to translate the signals placed on I/O pad 41 to the internal voltages used by the integrated circuit. A logical EXCLUSIVE OR ("XOR") gate 43 compares the voltage on output data line 47 to the output of level shifter 42. When these voltages are the same, the output placed on I/O pad 41 is not being overdriven. In this case logical XOR gate 43 places a logic 0 through a PGS circuit 44 to a shutdown line 49.

When XOR gate 43 detects the voltage on output data line 47 is at a different level than the output of level shifter 42, logical XOR gate 43 places a logic 1 to an input of PGS circuit 44. If the input of PGS circuit 44 remains at logic 1 for a predetermined length of time, the logic 1 is forwarded to shutdown line 49.

Shutdown line 48 may be logically connected to shutdown line 49 in a number of ways. For instance, if each I/O pad has a separate shutdown signal, shutdown line 48 may be directly connected to shutdown line 49, similar to the shutdown circuitry in FIG. 2. If a global shutdown signal is generated, a logical OR gate may combine the outputs of shutdown signals from a plurality of shutdown lines into a global shutdown signal similar to the shutdown circuitry in FIG. 3. Additionally, the global shutdown signal once asserted may be held asserted by a flip-flop circuit similar to the shutdown circuitry shown in FIG. 4.

Figure 6:
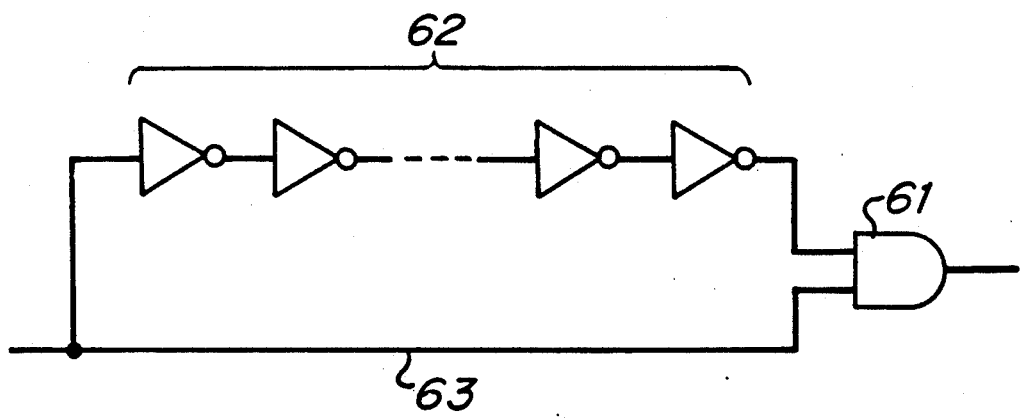
FIG. 6 shows a positive glitch suppression circuit used in the shutdown circuitry shown in FIGS. 1 through 5 in accordance with a preferred embodiment of the present invention.

FIG. 6 shows an implementation of a PGS circuit which may be used in the implementation of PGS circuit 4 shown in FIG. 2, PGS circuit 14 shown in FIG. 3, PGS circuit 24 shown in FIG. 4 or PGS circuit 44 shown in FIG. 5.

A logical AND gate 61 compares an input from a line 63 with input from a delay consisting of a row of buffers 62. The number of buffers in row of buffers 62 is selected so that propagation delay through row of buffers 62 is equivalent to the maximum time length of a glitch. The result is that when a logic 1 is placed on the input of the PGS circuit shown in FIG. 6, the logic 1 will not be amount of time has past sufficient to determine whether the logic 1 was generated by a glitch. When, as shown, logical NOT gates are used for row of buffers 62, it is necessary that there be an even number of logical NOT gates used.

I claim:

1. Circuitry for isolating an I/O pad of an integrated circuit when bus contention is detected, the circuitry comprising:
    an output data line on which the integrated circuit places an output datum;
    tri-state means, coupled to the output data line and to the I/O pad, for electrically connecting and disconnecting the output data line and the I/O pad, the tri-state means electrically disconnecting the output data line from the I/O pad when the tri-state means receives a shutdown signal;
    an output enable line on which the integrated circuit places an enable signal to indicate the output datum has been placed on the output data line;
    shutdown signal generator means, coupled to the I/O pad, the tri-state means and the output enable line, the shutdown signal generator means generating the shutdown signal when both the enable signal is placed on the output enable line and, for a predetermined length of time, a logical value of the output datum is different than a logical value on the I/O pad.

2. Circuitry as in claim 1 wherein the shutdown signal generator means additionally generates the shutdown signal when the enable signal is not placed on the output enable line.

3. Circuitry as in claim 2 wherein the shutdown signal generator means comprises:
    a level shifter with an input and an output, the input being connected to the I/O pad,
    a logical XOR gate, having a first input, a second input and an output, the first input of the logical XOR gate being coupled to the output of the level shifter and the second input of the logical XOR gate being coupled to the output data line;

a first logical AND gate having a first input, a second input and an output, the first input of the first logical AND gate being coupled to the output of the logical XOR gate;

a logical NOT gate having an input and an output, the input of the logical NOT gate being coupled to the output enable line and the output of the logical NOT gate being coupled to the second input of the first logical AND gate;

a positive glitch suppression circuit having an input and an output, the input of the positive glitch suppression circuit being coupled to the output of the first logical AND gate; and, a logical OR gate having a first input, a second input and an output, the first input of the logical OR gate being coupled to the output enable line, the second input of the glitch suppression circuit, and the output of the logical OR gate being coupled to the tri-state means.

4. Circuitry as in claim 3 wherein the positive glitch suppression circuit includes, a plurality of buffers connected in series, the plurality of buffers having an input and an output, the input of the plurality of buffers being coupled to the output of the first logical AND gate; and, a second logical AND gate, the second logical AND gate having a first input, a second input and an output, the first input of the second logical AND gate being coupled to the output of the first logical AND gate, the second input of the second logical AND gate being coupled to the output of the plurality of buffers and the output of the second logical AND gate being coupled to the second input of the logical OR gate.

5. Circuitry as in claim 4 wherein the plurality of buffers comprises an even number of logical NOT gates.

6. Circuitry for isolating I/O pads of an integrated circuit when bus contention is detected on any I/O pad, the integrated circuit including for each I/O pad an output data line on which the integrated circuit places a first signal representing an output datum, the circuitry comprising:

detecting means, coupled to each I/O pad, for detecting for each I/O pad whether the first signal is logically equal to a second signal which is on the I/O pad; and, connecting means, coupled to each I/O pad, to each output data line and to the detecting means, for connecting each I/O pad to the output data line for the I/O pad when output is enabled, except that the connecting means isolates each I/O pad from the output data line for the I/O pad when the detecting means detects that for any I/O pad the first signal does not equal the second signal for a predetermined length of time.

7. Circuitry for isolating I/O pads of an integrated circuit when bus contention is detected, the circuitry comprising:

an output data line for each I/O pad on which the integrated circuit places an output datum;

tri-state means for each I/O pad, coupled to the output data line of the I/O pad and to the I/O pad, for electrically connecting and disconnecting the output data line and the I/O pad, the tri-state means electrically disconnecting the output data line from the I/O pad when the tri-state means receives a global shutdown signal;

an output enable line for each I/O pad on which the integrated circuit places an enable signal to indicate the output datum has been placed on the output data line for the I/O pad;

shutdown signal generator means, coupled to every I/O pad, every tri-state means and every output enable line, the shutdown signal generator means generating the shutdown signal when for any I/O pad, and it associated output enable line and output data line, both the enable signal is placed on the output enable line and, for a predetermined length of time, a logical value on the output data line is different than a logical value on the I/O pad.

8. Circuitry as in claim 7 wherein the shutdown signal generator means comprises a global logical OR gate having an output and having a plurality of inputs and wherein the shutdown signal generator means comprises for each I/O pad and its associated output enable line and output data line:

a level shifter with an input and an output, the input being connected to the I/O pad, a logical XOR gate, having a first input, a second input and an output, the first input of the logical XOR gate being coupled to the output of the level shifter and the second input of the logical XOR gate being coupled to the output data line;

a first logical AND gate having a first input, a second input and an output, the first input of the first logical AND gate being coupled to the output of the logical XOR gate;

a logical NOT gate having an input and an output, the input of the logical NOT gate being coupled to the output enable line and the output of the logical NOT gate being coupled to the second input of the first logical AND gate;

a positive glitch suppression circuit having an input and an output, the input of the positive glitch suppression circuit being coupled to the output of the first logical AND gate and the output of the positive glitch suppression circuit being coupled to an input from the plurality of inputs of the global logical OR gate; and, a logical OR gate having a first input, a second input and an output, the first input of the logical OR gate being coupled to the output enable line, the second input of the logical OR gate being coupled to the output of the global logical OR gate, and the output of the logical OR gate being coupled to the tri-state means.

9. Circuitry as in claim 8 wherein each positive glitch suppression circuit includes, a plurality of buffers connected in series, the plurality of buffers having an input and an output, the input of the plurality of buffers being coupled to the output of the first logical AND gate; and, a second logical AND gate, the second logical AND gate having a first input, a second input and an output, the first input of the second logical AND gate being coupled to the output of the first logical AND gate, the second input of the second logical AND gate being coupled to the output of the plurality of buffers and the output of the second logical AND gate being coupled to the second input of the logical OR gate.

10. Circuitry as in claim 9 wherein the plurality of buffers comprises an even number of logical NOT gates.

11. Circuitry as in claim 7 wherein once the shutdown signal generator means generator generates the shutdown signal, the shutdown signal generator holding the shutdown signal until the signal generator means receives a reset signal.

12. Circuitry as in claim 11
wherein the shutdown signal generator means comprises
a global logical OR gate having an output and having a plurality of inputs, and
a flip-flop having a set input, a reset input and an output, the set input being coupled to the output of the global logical OR gate; and,
wherein the shutdown signal generator means comprises for each I/O pad and its associated output enable line and output data line:
a level shifter with an input and an output, the input being connected to the I/O pad,
a logical XOR gate, having a first input, a second input and an output, the first input of the logical XOR gate being coupled to the output of the level shifter and the second input of the logical XOR gate being coupled to the output data line;
a first logical AND gate having a first input, a second input and an output, the first input of the first logical AND gate being coupled to the output of the logical XOR gate;
a logical NOT gate having an input and an output, the input of the logical NOT gate being coupled to the output enable line and the output of the logical NOT gate being coupled to the second input of the first logical AND gate;
a positive glitch suppression circuit having an input and an output, the input of the positive glitch suppression circuit being coupled to the output of the first logical AN gate and the output of the positive glitch suppression circuit being coupled to an input from the plurality of inputs of the global logical OR gate; and,
a logical OR gate having a first input, a second input and an output, the first input of the logical OR gate being coupled to the output enable line, the second input of the logical OR gate being coupled to the output of the flip-flop, and the output of the logical OR gate being coupled to the tri-state means.

13. Circuitry as in claim 12 wherein each positive glitch suppression circuit includes,
a plurality of buffers connected in series, the plurality of buffers having an input and an output, the input of the plurality of buffers being coupled to the output of the first logical AND gate; and,
a second logical AND gate, the second logical AND gate having a first input, a second input and an output, the first input of the second logical AND gate being coupled to the output of the first logical AND gate, the second input of the second logical AND gate being coupled to the output of the plurality of buffers and the output of the second logical AND gate being coupled to the second input of the logical OR gate.

14. Circuitry as in claim 13 wherein the plurality of buffers comprises an even number of logical NOT gates.

15. A method for protecting circuitry within an integrated circuit, for each I/O pad of the integrated circuit, the method comprising the steps of:
(a) comparing a first signal on an output data line with a second signal on the I/O pad; and,
(b) when output to the I/O pad is enabled, electrically isolating the I/O pad from the output data line when the comparison in step (a) indicates the first signal is not logically equal to the second signal.

16. A method as in claim 15 wherein step (b) includes delaying electrically isolating the I/O pad from the output data line until the first signal is not logically equal to the second signal for a predetermined length of time, the length of time being sufficient to allow for glitch suppression.

17. A method as in claim 15 additionally comprising the step of:
(c) electrically isolating the I/O pad from the output data line when, for any other I/O pad, a comparison indicates the first signal for the other I/O pad is not logically equal to the second signal for the other I/O pad.

18. A method as in claim 17 additionally comprising the step of:
(d) once the I/O pad has been electrically isolated as a result of a comparison in one of step (b) and step (c), maintaining the electrical isolation until a reset signal is received.

19. A method as in claim 18 wherein step (b) includes delaying electrically isolating the I/O pad from the output data line until the first signal is not logically equal to the second signal for a predetermined length of time, the length of time being sufficient to allow for glitch suppression.

20. A method as in claim 17 wherein step (b) includes delaying electrically isolating the I/O pad from the output data line until the first signal is not logically equal to the second signal for a predetermined length of time, the length of time being sufficient to allow for glitch suppression.

21. A method as in claim 15 additionally comprising the step of:
(c) once the I/O pad has been electrically isolated as a result of the comparison in step (b), maintaining the electrical isolation until a reset signal is received.

22. A method as in claim 21 wherein step (b) includes delaying electrically isolating the I/O pad from the output data line until the first signal is not logically equal to the second signal for a predetermined length of time, the length of time being sufficient to allow for glitch suppression.

* * * * *